United States Patent
Horibe

(10) Patent No.: US 8,772,088 B2
(45) Date of Patent: Jul. 8, 2014

(54) METHOD OF MANUFACTURING HIGH FREQUENCY MODULE AND HIGH FREQUENCY MODULE

(75) Inventor: Takayuki Horibe, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 74 days.

(21) Appl. No.: 13/367,393

(22) Filed: Feb. 7, 2012

(65) Prior Publication Data

US 2012/0199958 A1     Aug. 9, 2012

(30) Foreign Application Priority Data

Feb. 9, 2011    (JP) ................................. 2011-025832

(51) Int. Cl.
    *H01L 23/552*         (2006.01)

(52) U.S. Cl.
USPC ........... 438/113; 438/107; 438/110; 438/112; 438/119; 438/124; 257/659; 257/676; 257/660; 257/734; 257/E21.599; 257/E23.114; 257/E23.037; 257/E21.511; 257/E21.518; 343/905; 29/830

(58) Field of Classification Search
CPC ....... H01L 24/97; H01L 24/94; H01L 25/072; H01L 25/162; H03F 3/189; H05K 1/0243; H05K 1/16; H05K 1/0218; H05K 1/0237
USPC ................... 257/E21.599, E23.114, E21.602, 257/E23.031, E21.511, E21.518, E21.506, 257/659, 676, 660; 438/113, 107, 110, 124; 343/905; 29/830
See application file for complete search history.

(56) References Cited

U.S. PATENT DOCUMENTS

| | | |
|---|---|---|
| 2007/0145539 A1 | 6/2007 | Lam |
| 2010/0172116 A1 | 7/2010 | Yorita et al. |
| 2011/0006408 A1 | 1/2011 | Liao |

FOREIGN PATENT DOCUMENTS

| | | | |
|---|---|---|---|
| JP | 2006-332225 A | | 12/2006 |
| JP | 2008-288610 A | | 11/2008 |
| JP | 2009-218484 A | | 9/2009 |
| JP | 2009218484 A | * | 9/2009 |
| JP | 2010-114291 A | | 5/2010 |

OTHER PUBLICATIONS

Official Communication issued in corresponding Japanese Patent Application No. 2011-025832, mailed on Mar. 12, 2013.

* cited by examiner

*Primary Examiner* — Jerome Jackson, Jr.
*Assistant Examiner* — Bo Fan
(74) *Attorney, Agent, or Firm* — Keating & Bennett, LLP

(57) ABSTRACT

In a high frequency module, electronic components are mounted on a mounting surface of a collective substrate including a plurality of unit substrates that include a via conductor electrically conducted to a ground potential in a peripheral portion thereof, and the mounting surface and the electronic components are encapsulated with an encapsulation layer. The collective substrate is cut on the encapsulation layer side, thereby forming a half-cut groove penetrating through the encapsulation layer and extending halfway along the collective substrate in a thickness direction such that the via conductor is exposed only at a bottom surface of the half-cut groove. A conductive shield layer is formed to cover the encapsulation layer and is electrically conducted to the exposed via conductor. The collective substrate is then cut into individual unit substrates each including the conductive shield layer electrically conducted to the ground potential through the via conductor.

3 Claims, 18 Drawing Sheets

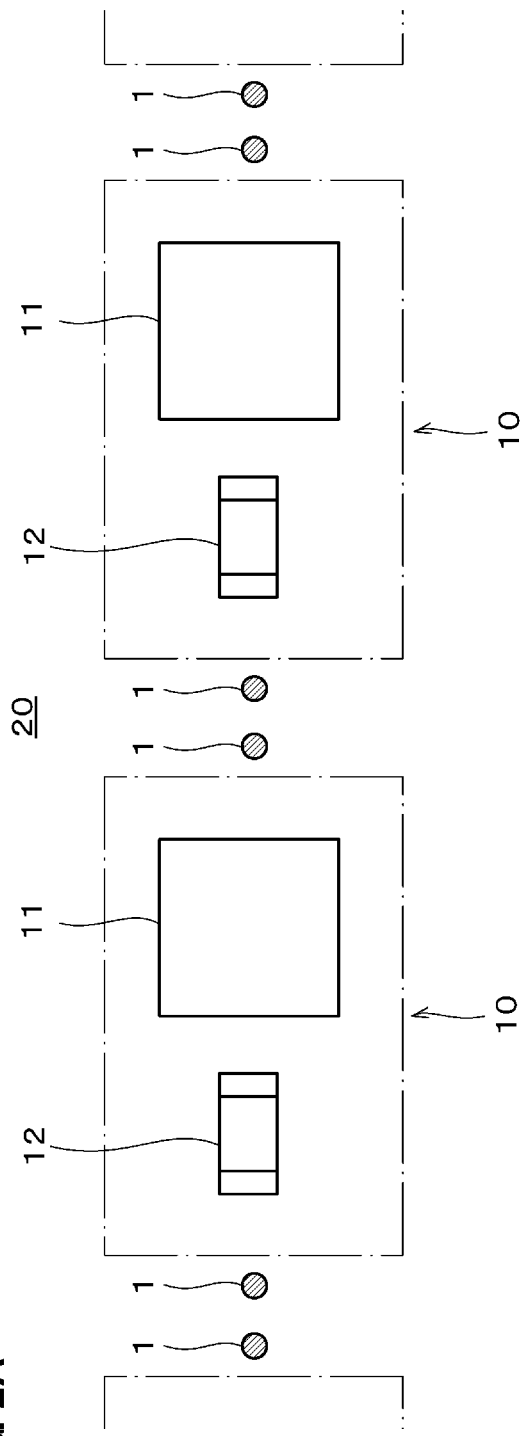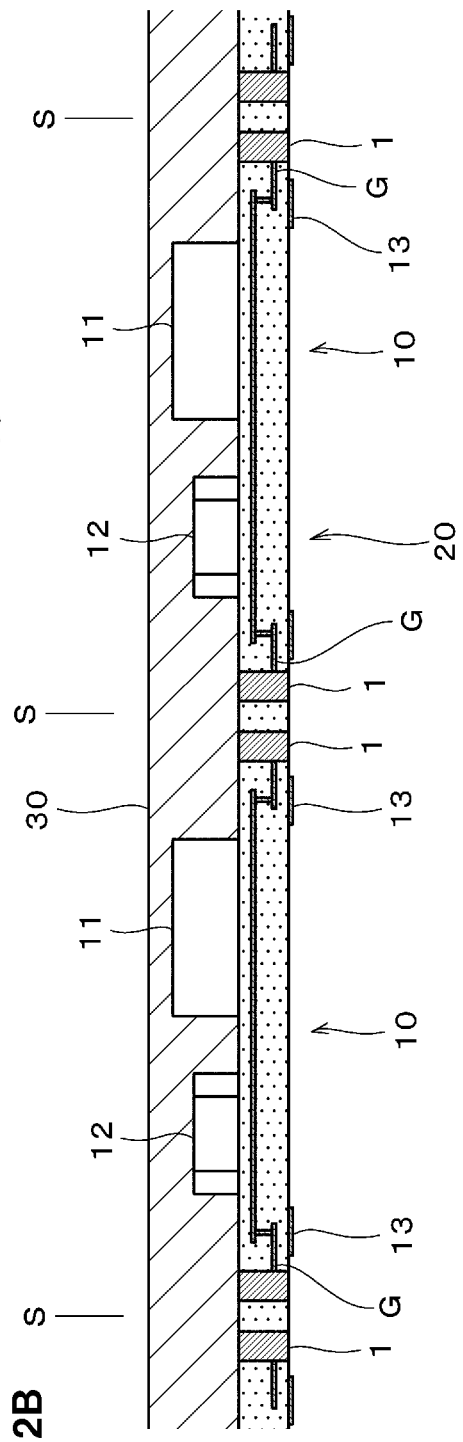

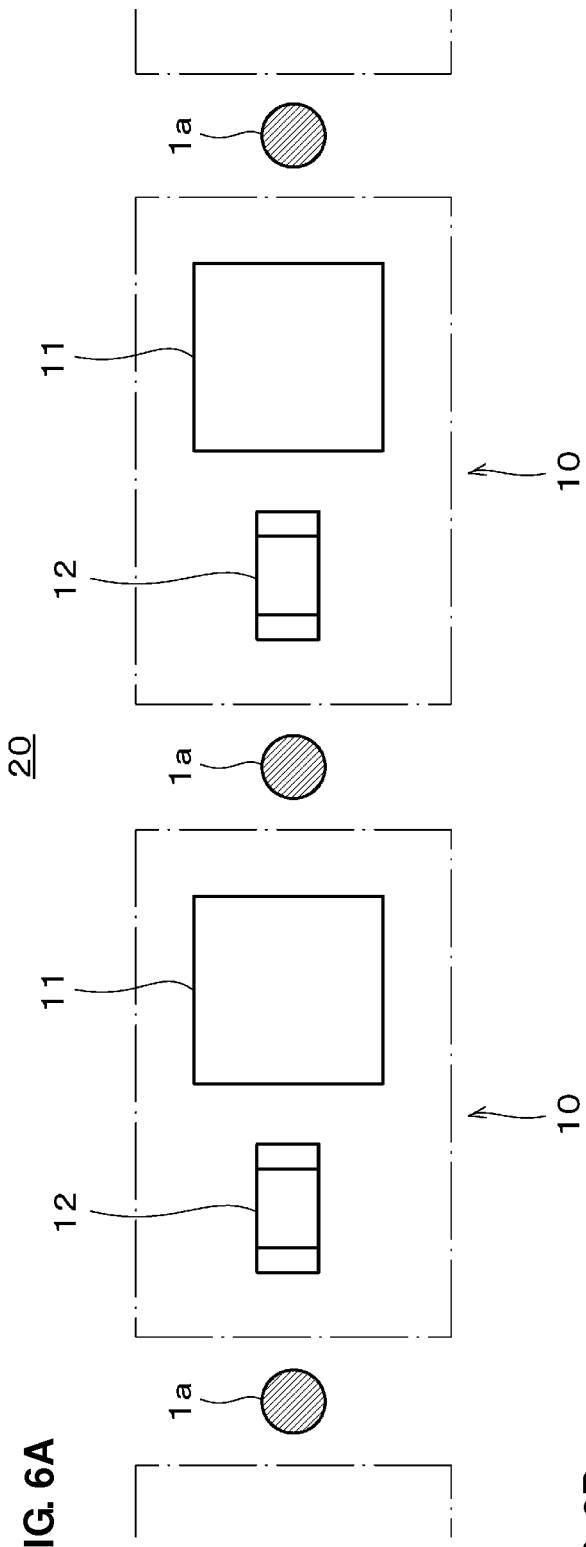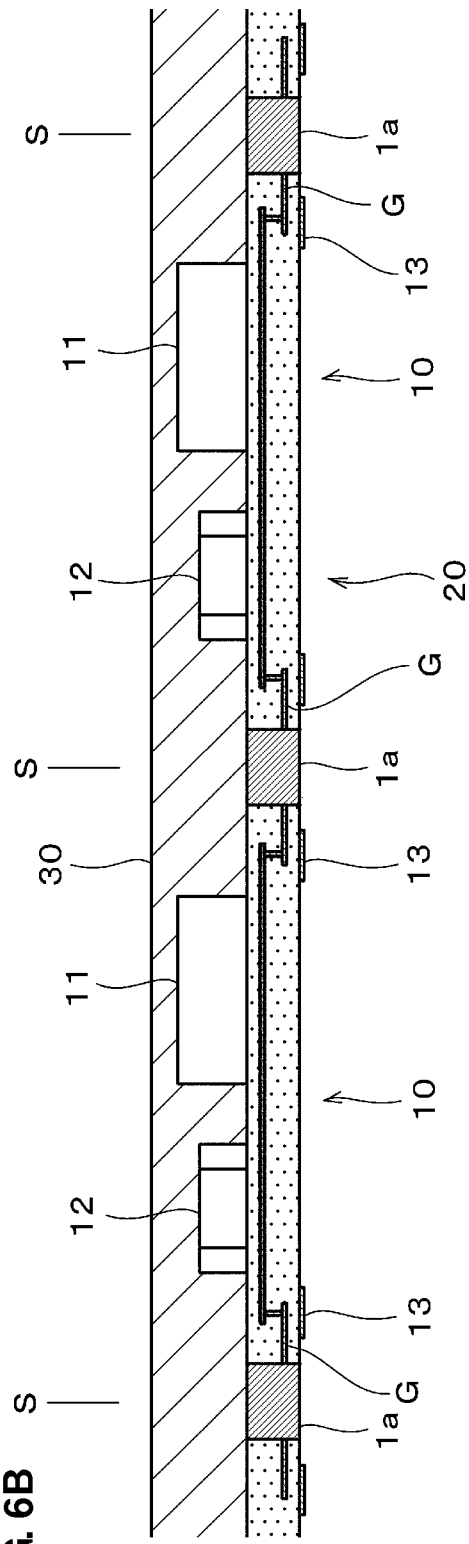

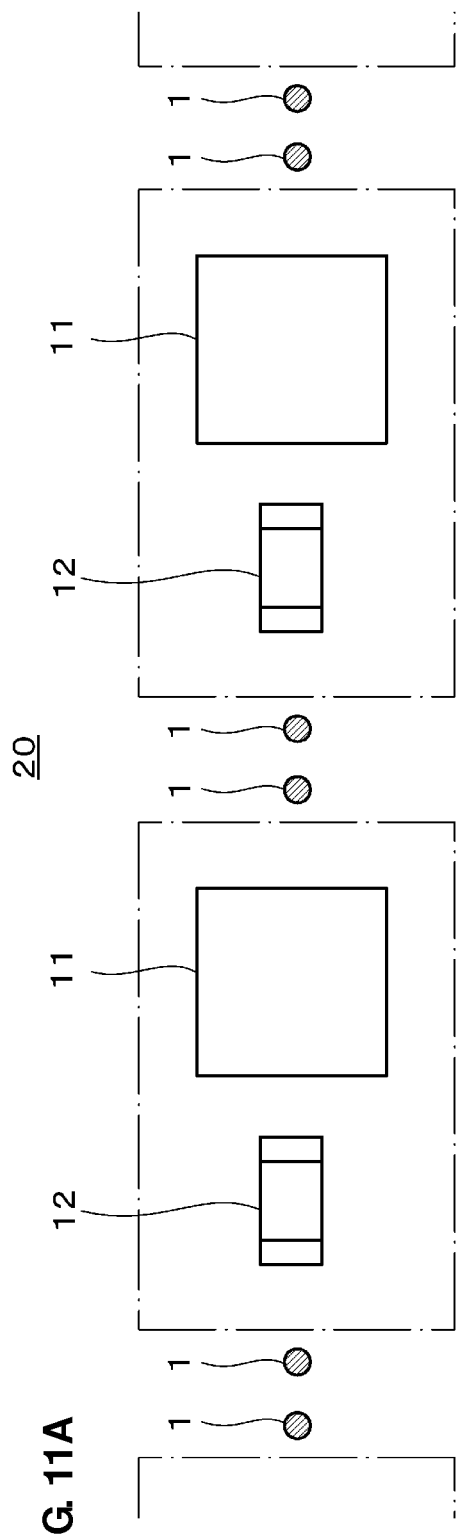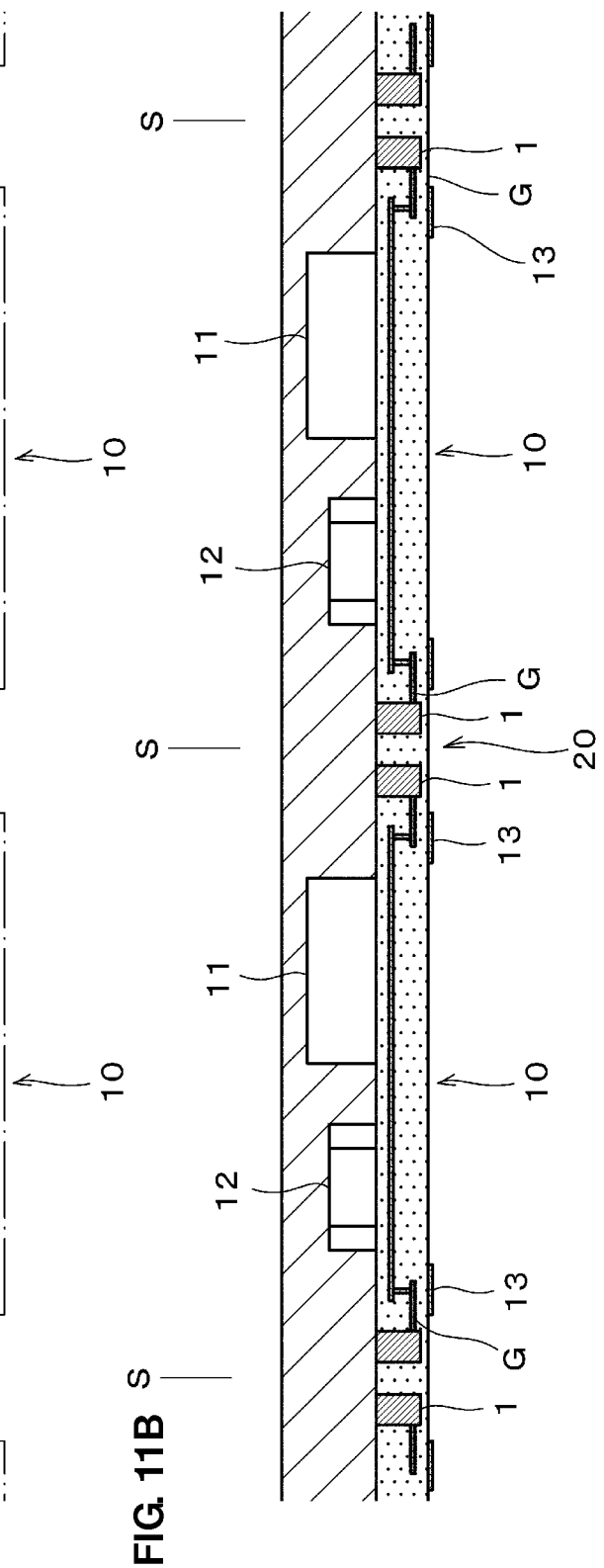

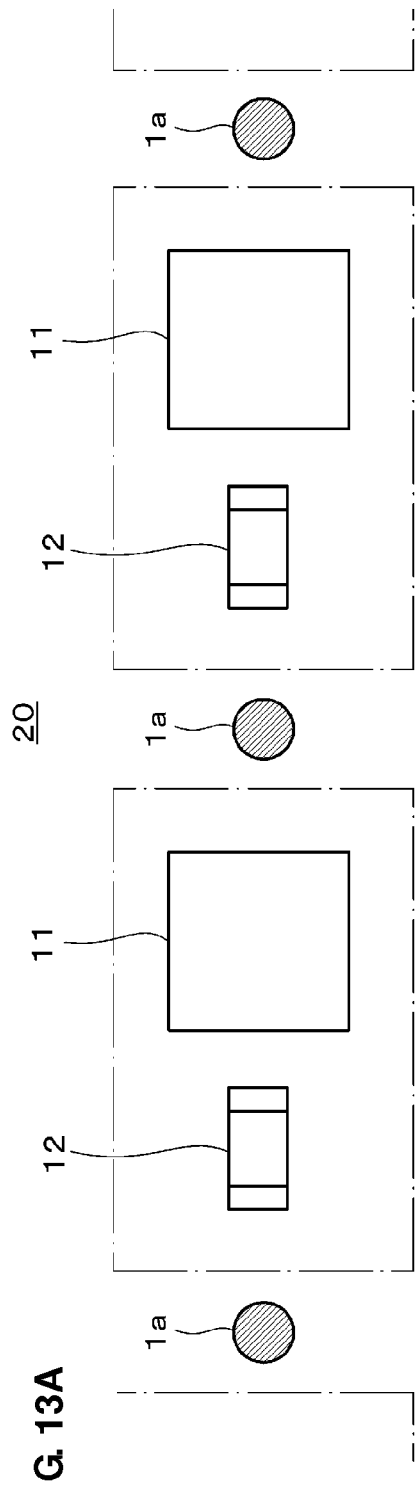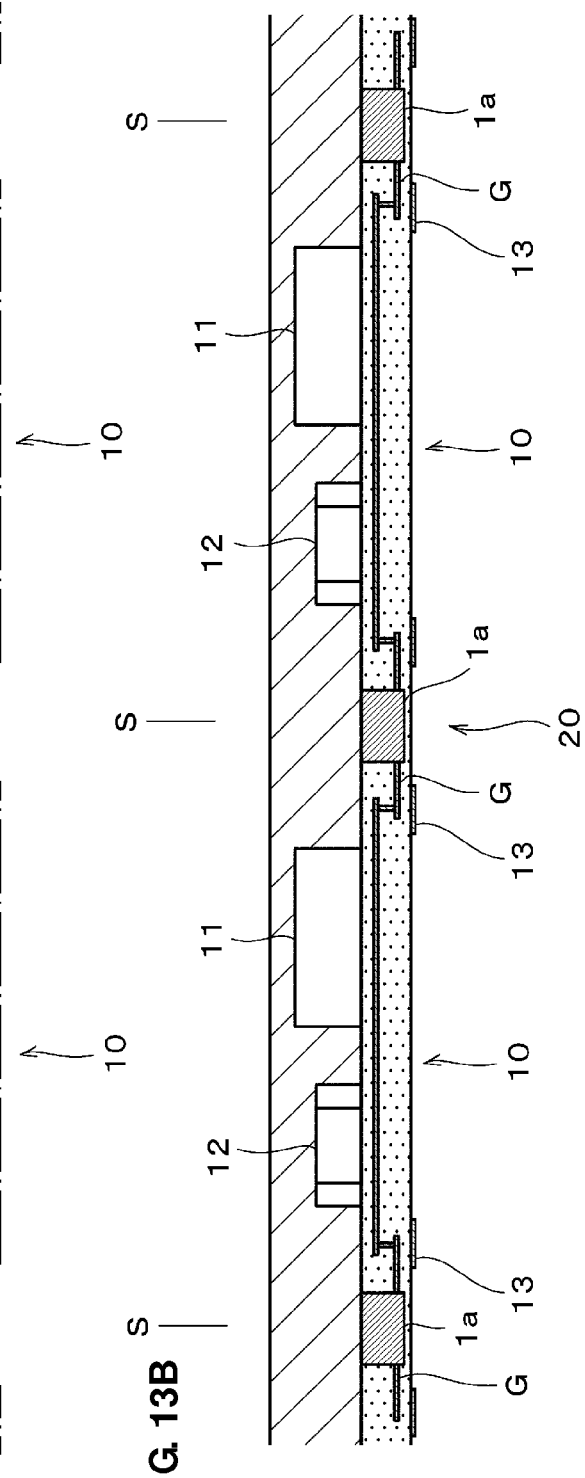

METHOD OF MANUFACTURING HIGH FREQUENCY MODULE AND HIGH FREQUENCY MODULE

BACKGROUND OF THE INVENTION

1. Field of the Invention

The present invention relates to a method of manufacturing a high frequency module and to the high frequency module. More particularly, the present invention relates to a method of manufacturing a high frequency module having a structure in which a component mounting surface of a unit substrate, on which an electronic component is mounted, is encapsulated (covered in a sealed condition) with an encapsulation layer made of an insulating material, and in which a conductive shield layer electrically conducted to a ground potential covers the encapsulation layer. The present invention also relates to the high frequency module manufactured by the above-mentioned manufacturing method.

2. Description of the Related Art

As one of high frequency modules, there is a high frequency module in which an electronic component is mounted on a component mounting surface of a substrate, the component mounting surface and the electronic component are encapsulated with an encapsulation layer made of, e.g., an insulating material, and a surface of the encapsulation layer (i.e., a module surface) is covered with a conductive shield layer made of an electroconductive material and electrically conducting the module surface to a ground potential, thereby reducing intrusion of electromagnetic waves from the outside and leakage of electroconductive waves to the outside.

As a method of manufacturing the high frequency module having such a structure, the following method is proposed (see Japanese Unexamined Patent Application Publication No. 2009-218484).

According to the method disclosed in Japanese Unexamined Patent Application Publication No. 2009-218484, as illustrated in FIG. 16, electronic components 102 and 103 are mounted on a collective substrate 110a, which is a collective body including a plurality of unit substrates 110 and electrodes (via conductors) 101 electrically conducted to a ground potential (ground electrode G), and a component mounting surface of the collective substrate 110a and the electronic components 102 and 103 are encapsulated with an encapsulation layer (encapsulation resin) 104.

Then, as illustrated in FIG. 17, the collective substrate 110a encapsulated with the encapsulation resin 104 is cut along a reference line S from the side containing the encapsulation layer (encapsulation resin) 104, thereby forming a half-cut groove 105 that penetrates through the encapsulation layer (encapsulation resin) 104 and that extends up to a position halfway the collective substrate 110a in the direction of thickness thereof. With the formation of the half-cut groove 105, each via conductor 101 is exposed at a lateral surface 105a and a bottom surface 105b of the half-cut groove 105 such that a contact area between the via conductor 101 and a conductive shield layer 106 (described below) can be sufficiently obtained.

Then, as illustrated in FIG. 18, the conductive shield layer 106 is formed such that it covers the encapsulation layer (encapsulation resin) 104 and it is electrically conducted to the via conductor 101 exposed at the lateral surface 105a and the bottom surface 105b of the half-cut groove 105.

Further, after carrying out various necessary steps, the collective substrate 110a is divided into individual unit substrates (electronic modules) 110.

In such a manner, the method of manufacturing the electronic module, disclosed in Japanese Unexamined Patent Application Publication No. 2009-218484, provides the electronic module in which the electronic components 102 and 103 are mounted on the substrate (unit substrate) 110, the electronic components 102 and 103 and the mounting surface for those electronic components are encapsulated with the encapsulation layer (encapsulation resin) 104, and the surface of the encapsulation layer (encapsulation resin) 104 is covered with the conductive shield layer that is electrically conducted to the ground potential.

Moreover, with the method disclosed in Japanese Unexamined Patent Application Publication No. 2009-218484, when the collective substrate 110a is half-cut, a lateral portion of the via conductor 101 is also partly cut such that a lateral surface 101a of the via conductor 101, which surface has been formed by the half-cutting, is exposed at the lateral surface 105a of the half-cut groove 105, and such that a horizontal surface 101b of the via conductor 101 (i.e., a horizontal surface of the via conductor, which surface has been formed by the half-cutting) is exposed at the bottom surface 105b of the half-cut groove 105. Therefore, a contact area between the conductive shield layer 106 and the via conductor 101 at the ground potential is increased and high reliability in electrical connection can be ensured with such a feature.

However, the method disclosed in Japanese Unexamined Patent Application Publication No. 2009-218484 has a problem in that, because the lateral surface 101a and the bottom surface 101b of the via conductor 101 are both exposed to increase the contact area between the conductive shield layer 106 and the via conductor 101, there is a risk that the via conductor 101 may slip off of the collective substrate 110a and fall into the half-cut groove 105. This gives rise to a problem of reducing reliability.

As another module manufacturing method, there is disclosed a method of manufacturing a circuit module, the method including the steps of half-cutting a collective substrate such that an inner electrode layer (in-plane electrode), which is disposed inside the collective substrate and which is held at a ground potential, is exposed at a lateral surface of a half-cut groove, and then connecting a conductive shield layer to the in-plane electrode exposed at the lateral surface of the half-cut groove (see Japanese Unexamined Patent Application Publication No. 2008-288610, FIG. 3).

However, the method disclosed in Japanese Unexamined Patent Application Publication No. 2008-288610 has the following problem. Because the thickness of the inner electrode layer (in-plane electrode) to be electrically conducted to the conductive shield layer is much smaller (thinner) than the depth of the half-cut groove, the inner electrode layer (in-plane electrode) cannot be exposed at the lateral surface of the half-cut groove in some cases depending on accuracy in depth size of the half-cut groove. For example, when the inner electrode layer (in-plane electrode) is formed at a position near a lower surface of the collective substrate, it is difficult to form the half-cut groove so as to not cut through the collective substrate and such that the inner electrode layer (in-plane electrode) is exposed at the lateral surface of the half-cut groove.

Another problem is that, even when the inner electrode layer (in-plane electrode) can be exposed at the lateral surface of the half-cut groove, reliability in electrical connection tends to become insufficient for the reason that the thickness of the inner electrode layer (in-plane electrode) is thin and hence the contact area between the conductive shield layer and the inner electrode layer (in-plane electrode) is small.

SUMMARY OF THE INVENTION

In view of the problems described above, preferred embodiments of the present invention provide a method of manufacturing a highly-reliable high frequency module, which can positively connect a conductive shield layer and a via conductor at a ground potential to each other and can reduce intrusion of electromagnetic waves from the outside and leakage of electroconductive waves to the outside, while preventing slipping-off of the via conductor to which the conductive shield layer is connected, and also provide the highly-reliable high frequency module that can be manufactured by the above-mentioned manufacturing method.

According to one preferred embodiment of the present invention, there is provided a method of manufacturing a high frequency module having a structure in which an electronic component is mounted on a component mounting surface of a unit substrate including a via conductor electrically conducted to a ground potential, the component mounting surface is encapsulated with an encapsulation layer, which is made of an insulating material, along with the electronic component, and a conductive shield layer is disposed in a state covering the encapsulation layer and being electrically conducted to the via conductor, the method including the steps of preparing a collective substrate including a plurality of unit substrates successively connected in a matrix pattern, each of the unit substrates including the via conductor electrically conducted to the ground potential in a peripheral portion thereof; mounting predetermined electronic components on a component mounting surface of the collective substrate; encapsulating the component mounting surface of the collective substrate and the electronic components with the encapsulation layer made of the insulating material; cutting the collective substrate including the encapsulation layer disposed thereon from a substrate surface on the side including the encapsulation layer, thereby forming a half-cut groove penetrating through the encapsulation layer for division thereof and extending up to a position halfway along the collective substrate in a direction of thickness thereof such that the via conductor is exposed only at a bottom surface of the half-cut groove; forming a conductive shield layer in a state covering the encapsulation layer and being electrically conducted to the via conductor that is exposed at the bottom surface of the half-cut groove; and cutting the collective substrate for division into individual unit substrates each including the via conductor and the conductive shield layer electrically conducted to the ground potential through the via conductor.

In the method of manufacturing the high frequency module, according to another preferred embodiment of the present invention, looking at a pair of unit substrates adjacent to each other with the half-cut groove interposed between the pair of unit substrates, the via conductor exposed at the bottom surface of the half-cut groove is disposed in a straddling relationship over the pair of unit substrates; in the step of cutting the collective substrate for division into individual unit substrates, the via conductor straddling the pair of unit substrates is divided into two via conductors that belong respectively to the pair of unit substrates; and in each of the pair of unit substrates after being divided, the conductive shield layer is electrically conducted to the ground potential through one of the two divided via conductors.

In the method of manufacturing the high frequency module according to still another preferred embodiment of the present invention, preferably, the via conductor is formed in a state penetrating through the collective substrate.

According to still another preferred embodiment of the present invention, there is provided a high frequency module including a substrate including a component mounting surface on which an electronic component is mounted, and a peripheral portion defining a stepped portion at a level lower than a level of the component mounting surface; an outer electrode disposed on a bottom surface of the substrate and held at a ground potential; an encapsulation layer made of an insulating material and encapsulating the electronic component along with the component mounting surface; a conductive shield layer covering the encapsulation layer; and a via conductor arranged to penetrate through the stepped portion provided in the peripheral portion of the substrate such that the conductive shield layer and the outer electrode are electrically conducted to each other, wherein the via conductor is connected to the conductive shield layer only at an end surface thereof, which is exposed at a surface of the stepped portion of the substrate.

Thus, with the method of manufacturing the high frequency module according to a preferred embodiment of the present invention, the collective substrate mounting the electronic components thereon and encapsulated with the encapsulation layer is cut from the substrate surface on the side containing the encapsulation layer, thereby forming the half-cut groove penetrating through the encapsulation layer for division thereof and extending up to the position halfway along the collective substrate in the direction of thickness thereof such that the via conductor is exposed at the bottom surface of the half-cut groove. After forming the conductive shield layer in the state covering the encapsulation layer and being electrically conducted to the via conductor that is exposed at the bottom surface of the half-cut groove, the collective substrate is cut at predetermined positions for division into individual unit substrates each including the conductive shield layer electrically conducted to the ground potential through the via conductor. Therefore, unlike the above-described related art (Japanese Unexamined Patent Application Publication No. 2009-218484), the via conductor is not exposed at a lateral surface of the half-cut groove, and the via conductor is prevented from slipping off from the lateral surface of the half-cut groove. As a result, the conductive shield layer and the via conductor at the ground potential can be positively connected to each other, and the high frequency module having high reliability can be efficiently manufactured.

Also, since the via conductor has a larger thickness than that of, e.g., an inner electrode layer disposed inside the substrate, the conductive shield layer can be positively connected to the via conductor at the ground potential without being substantially affected by accuracy in depth size of the half-cut groove.

It is to be noted that the peripheral portion of the collective substrate used in a preferred embodiment of the present invention, such as expressed in " . . . , each of the unit substrates including the via conductor electrically conducted to the ground potential in a peripheral portion thereof; . . . ", implies a region, which is positioned near an outer periphery of the unit substrate when the collective substrate is viewed from above, and which includes no elements constituting the high frequency module, thus imposing no obstructions to the formation of the half-cut groove.

Further, with a preferred embodiment of the present invention, the high frequency module preferably is manufactured as follows. Looking at a pair of unit substrates adjacent to each other with the half-cut groove interposed between the pair of unit substrates, the via conductor exposed at the bottom surface of the half-cut groove is disposed in a straddling relationship over the pair of unit substrates. In the step of cutting the collective substrate for division into individual unit substrates, the via conductor straddling over the pair of unit substrates is divided into two via conductors that belong respectively to the pair of unit substrates. In each of the pair of unit substrates after being divided, the conductive shield layer is electrically conducted to the ground potential through one of the two divided via conductors. In that case, a highly-reliable high frequency module in which the conductive shield layer and the via conductor at the ground potential are positively connected to each other can be manufactured with higher efficiency just by disposing one via conductor for every two unit substrates. As a result, a preferred embodiment of the present invention can be practiced with more advantageous effects.

When the via conductor is arranged to penetrate through the collective substrate, the size of the via conductor in the direction of thickness of the collective substrate can be maximized, and the conductive shield layer and the via conductor at the ground potential can be positively electrically conducted to each other by making the via conductor positively exposed at the bottom surface of the half-cut groove without being affected by the accuracy in depth size of the half-cut groove. As a result, a preferred embodiment of the present invention can be practiced with more advantageous effects.

Moreover, since the via conductor is preferably arranged to penetrate through the collective substrate, the via conductor can be firmly fixed to the unit substrate.

Still further, since the outer electrode connected to the via conductor is preferably provided on the bottom surface of the substrate, the outer electrode can be held at the ground potential and the degree of freedom in construction of the unit substrate can be increased.

With the high frequency module according to a preferred embodiment of the present invention, the outer electrode at the ground potential and the conductive shield layer are electrically conducted to each other through the via conductor that is arranged to penetrate through the stepped portion provided in the peripheral portion of the substrate (unit substrate), the conductive shield layer can be connected to the outer electrode at the ground potential through a shorter distance, and the shielding performance of the conductive shield layer can be increased.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 2A is a plan view illustrating principal portion of a collective substrate used in manufacturing the high frequency module illustrated in FIG. 1, the collective substrate being in a state where electronic components are mounted thereon, and FIG. 2B is a front sectional view illustrating a state in which a component mounting surface of the collective substrate, illustrated in FIG. 2A, is encapsulated with an encapsulation layer.

FIG. 6A is a plan view illustrating a state where electronic components are mounted on a collective substrate used in a second preferred embodiment of the present invention, and FIG. 6B is a front sectional view illustrating a state where a component mounting surface of the collective substrate, illustrated in FIG. 6A, is encapsulated with an encapsulation layer.

FIG. 11A is a plan view illustrating a state where electronic components are mounted on a collective substrate used in a third preferred embodiment of the present invention, and FIG. 11B is a front sectional view illustrating a state where a component mounting surface of the collective substrate, illustrated in FIG. 11A, is encapsulated with an encapsulation layer.

FIG. 13A is a plan view illustrating a state where electronic components are mounted on a collective substrate used in a fourth preferred embodiment of the present invention, and FIG. 13B is a front sectional view illustrating a state where a component mounting surface of the collective substrate, illustrated in FIG. 13A, is encapsulated with an encapsulation layer.

DETAILED DESCRIPTION OF THE PREFERRED EMBODIMENTS

Figure 1:
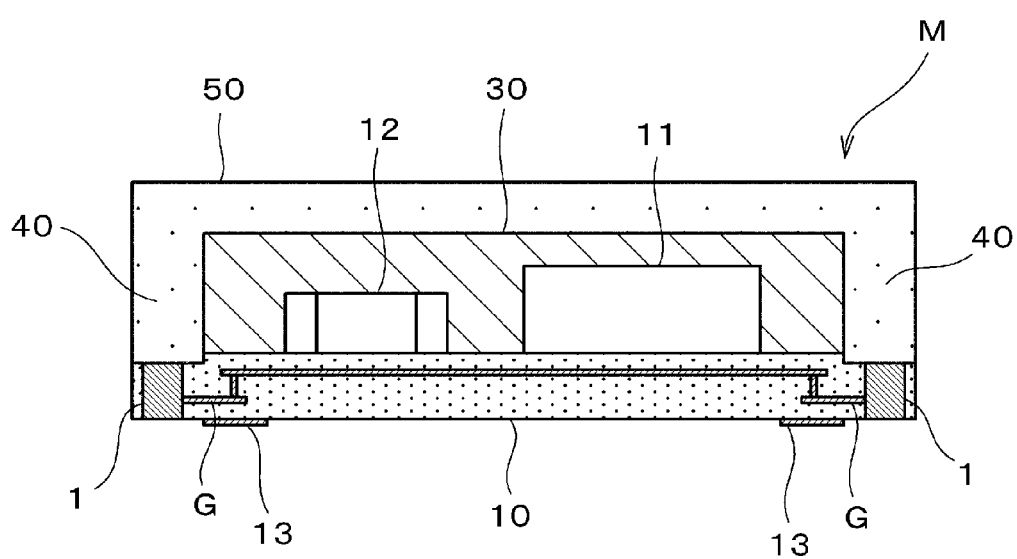
FIG. 1 is a front sectional view illustrating the construction of a high frequency module that is manufactured by a method according to a first preferred embodiment of the present invention

Features of the present invention will be described in detail below in connection with preferred embodiments of the present invention.

First Preferred Embodiment

A first preferred embodiment is described in connection with, e.g., a high frequency module M having a structure illustrated in FIG. 1. More specifically, electronic components (e.g., a semiconductor device 11 and a monolithic ceramic capacitor 12) are mounted on a component mounting surface of a unit substrate 10, which includes via conductors 1 and outer electrodes 13, each of the via conductors 1 being electrically conducted to a ground potential (ground electrodes G) (in this first preferred embodiment, the via conductors 1 are preferably arranged to penetrate through the unit substrate 10). The component mounting surface is encapsulated with an encapsulation layer 30, which is made of an insulating material, along with the electronic components 11 and 12. Further, a conductive shield layer 50 is disposed such that it covers the encapsulation layer 30 and it is electrically conducted to the via conductors 1.

It is to be noted that the layout of inner electrodes, e.g., the ground electrodes G, disposed inside the unit substrate 10, the layout of the electronic components 11 and 12 mounted on the unit substrate 10, etc. are depicted in FIG. 1 merely illustrative, and that they can be optionally disposed in various layouts as required.

A method of manufacturing the high frequency module M, illustrated in FIG. 1, will be described below.

First, as illustrated in FIGS. 2A and 2B, a collective substrate 20 is prepared to include a plurality of unit substrates 10 successively connected in a matrix pattern. Each of the unit substrates 10 includes, in peripheral portions thereof, the via conductors 1 electrically conducted to the ground potential (ground electrode G), and the outer electrodes 13. FIG. 2A is a plan view illustrating a state in which the electronic components 11 and 12 are mounted on the collective substrate 20 that is used in manufacturing the high frequency module illustrated in FIG. 1, and FIG. 2B is a front sectional view illustrating a state where a component mounting surface of the collective substrate 20, illustrated in FIG. 2A, is encapsulated with the encapsulation layer 30.

In the collective substrate 20 according to the first preferred embodiment, the via conductors 1 are preferably formed to penetrate through the respective unit substrates 10 constituting the collective substrate 20 from the upper surface side to the lower surface side.

In another preferred embodiment of the present invention, however, the via conductor 1 may be disposed inside the collective substrate 20 such that the via conductor 1 does not penetrate through the collective substrate 20, which is divided into the individual unit substrates 10.

Then, the predetermined electronic components 11 and 12 are mounted on each of the unit substrates 10 constituting the collective substrate 20 (see FIG. 2A).

In various preferred embodiments of the present invention, the electronic components to be mounted are not limited to particular types, and various types of electronic components, which are required to constitute the high frequency module, can be optionally mounted.

Then, the encapsulation layer (insulating layer) 30 made of an insulating material is formed to encapsulate the component mounting surface of the collective substrate 20 and the electronic components 11 and 12 mounted on the component mounting surface (see FIG. 2B).

The encapsulation layer 30 can be made of, for example, an insulating resin, such as an epoxy resin, or a material prepared by mixing an inorganic filler, such as silica or aluminum hydroxide, to the insulating resin. The encapsulation layer 30 is preferably formed, as illustrated in FIG. 2B, by coating suitable one of those materials and curing it.

Figure 3:
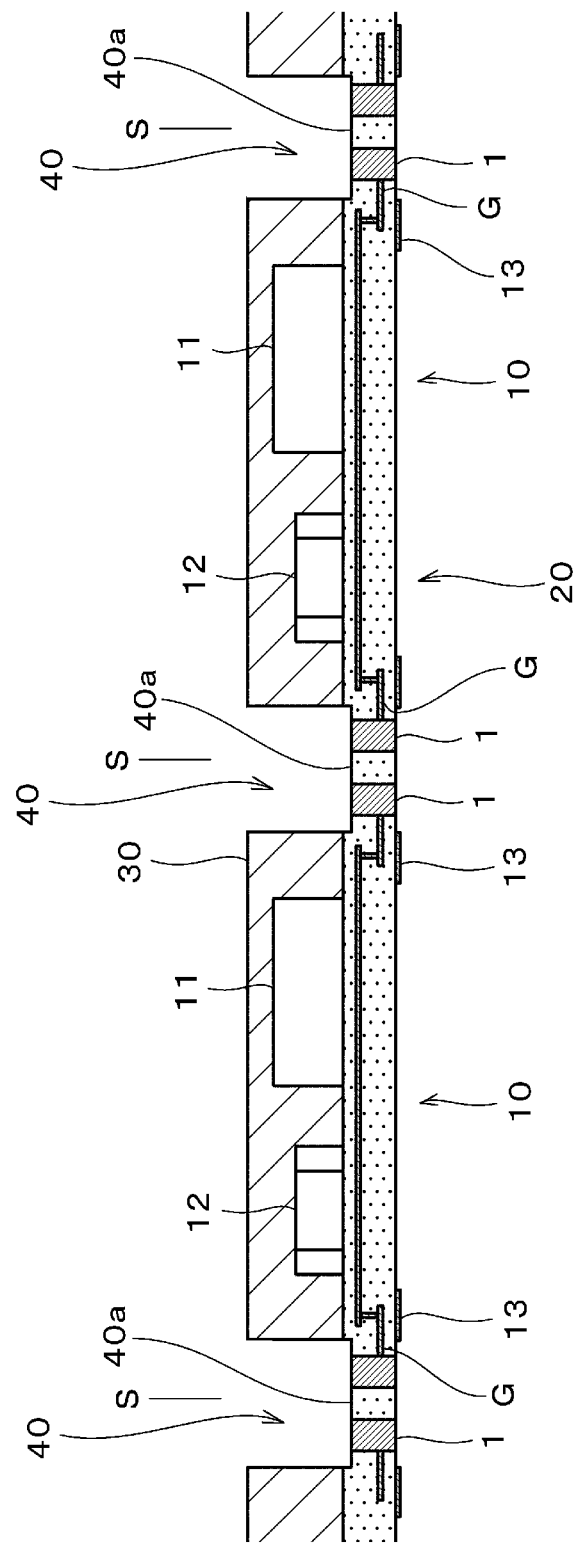
FIG. 3 is a front sectional view illustrating a state where a half-cut groove is formed in the collective substrate, illustrated in FIG. 2B, after forming the encapsulation layer.

Then, as illustrated in FIG. 3, the collective substrate 20 including the encapsulation layer 30 disposed thereon is cut from a substrate surface on the side containing the encapsulation layer 30 by using a dicing blade, thereby forming a half-cut groove 40 that penetrates through the encapsulation layer 30 for division thereof, and that extends up to a position halfway the collective substrate 20 in the direction of thickness thereof. With the formation of the half-cut groove 40, the via conductor 1 is exposed at a bottom surface 40a of the half-cut groove 40. In this state, only an upper end surface of the via conductor 1 is exposed at the bottom surface 40a of the half-cut groove 40, while other portions of the via conductor 1 are not exposed and are positioned inside the collective substrate 20. As a result, the via conductor 1 is prevented from slipping off and it can be positively held in the collective substrate 20.

In the first preferred embodiment, the half-cutting is preferably performed by using a dicing blade with such a width that the dicing blade can cut at a time a region (see FIGS. 2A and 2B, etc.) including positions where both of two via conductors 1 present between the unit substrates 10 adjacent to each other are located, whereby both the via conductors 1 can be exposed at the bottom surface 40a of the half-cut groove 40. As a result of the half-cutting described above, both of the two via conductors 1 present between the unit substrates 10 adjacent to each other can be efficiently exposed at the bottom surface 40a of the half-cut groove 40 just by performing the half-cutting once.

Figure 4:
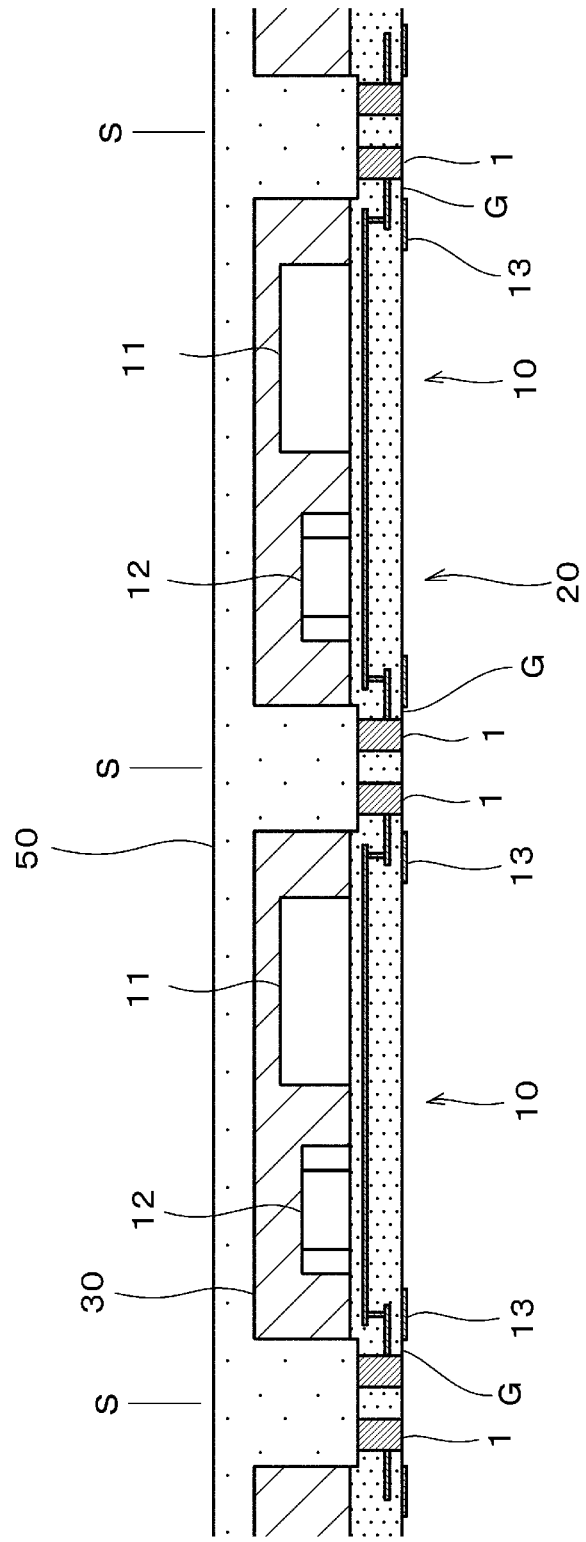
FIG. 4 is a front sectional view illustrating a state where a conductive shield layer is formed on the collective substrate, illustrated in FIG. 3, after forming the half-cut groove.

Then, as illustrated in FIG. 4, the conductive shield layer 50 is formed such that it covers the encapsulation layer 30 and it is electrically conducted to the via conductor 1 exposed at the bottom surface 40a of the half-cut groove 40.

In this first preferred embodiment, the conductive shield layer 50 is formed by coating an electroconductive resin, which contains an electroconductive component (usually metal powder) and a resin as main components, in a state covering the encapsulation layer 30 and filling the half-cut groove 40, and by curing the coated electroconductive resin. The conductive shield layer 50 fulfills the shielding function by forming the conductive shield layer 50 in the state covering the encapsulation layer 30 and being connected to the via conductor 1 that is exposed at the bottom surface 40a of the half-cut groove and that is electrically conducted to the ground potential (ground electrode G). The conductive shield layer 50 can be optionally made of various electroconductive resins each containing, as mentioned above, an electroconductive component and a resin as main components, or electroconductive metal materials, e.g., plated metals.

Figure 5:
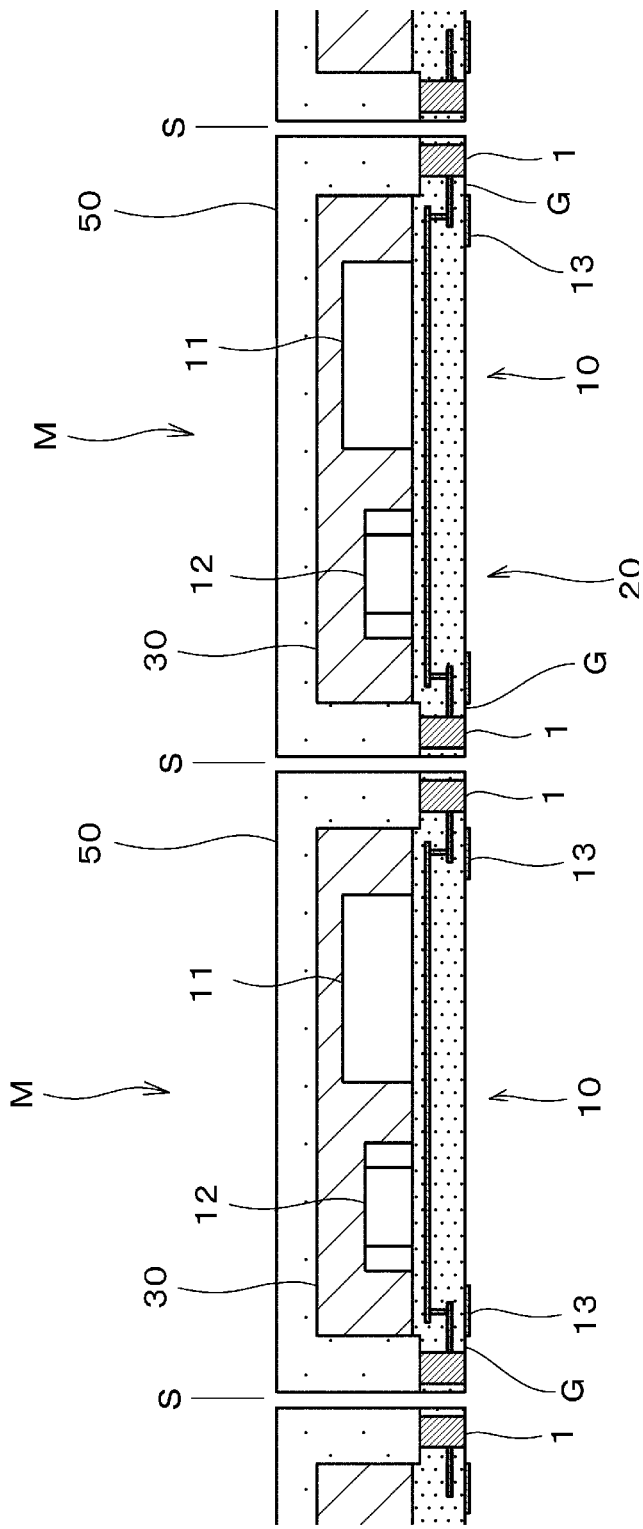
FIG. 5 is a front sectional view illustrating a state where the collective substrate, illustrated in FIG. 4, is cut at predetermined positions and is divided into individual unit substrates.

Then, the collective substrate 20 is cut along predetermined cut lines (reference positions) S, whereby the collective substrate 20 is divided into the individual unit substrates 10 as illustrated in FIG. 5. At that time, the collective substrate 20 is cut by using a blade with a narrower width than that of the dicing blade used in the above-described half-cutting step in order that the via conductor 1 is present in each of the divided unit substrates 10, and that the unit substrate (high frequency module) is obtained in which the conductive shield layer 50 is positively electrically conducted to the ground electrode G through the via conductor 1.

As a result, the individual unit substrates 10 (high frequency modules M) each having the structure illustrated in FIG. 1, in which the via conductor 1 is disposed and the conductive shield layer 50 is electrically conducted to the ground electrode G through the via conductor 1, can be obtained.

While, in the high frequency module M according to the first preferred embodiment, as illustrated in FIG. 1, one via conductor 1 positioned at each of the left and right sides (i.e., two of the via conductors 1 in total) are connected to the conductive shield layer 50, the number of the via conductors 1 connected to the conductive shield layer 50 is not limited. However, by connecting a plurality of via conductors 1 to the conductive shield layer 50, the conductive shield layer 50 can be more positively connected to the ground and reliability can be increased.

Second Preferred Embodiment

In the first preferred embodiment described above, the collective substrate 20 is preferably used and includes two via conductors 1 penetrating through the collective substrate 20 disposed between each pair of unit substrates 10 adjacent to each other. After the division into the individual unit substrates 10, one of the two via conductors 1 is positioned in one of the paired unit substrates 10 and the other one of the two via conductors 1 is positioned in the other unit substrate 10. On the other hand, a second preferred embodiment preferably uses a collective substrate 20 structured, as illustrated in FIGS. 6A and 6B, such that one via conductor 1a (i.e., a via conductor 1a before being divided) penetrating through the collective substrate 20 is disposed between the unit substrates 10 adjacent to each other, and such that when the collective substrate 20 is divided into individual unit substrates 10, the one via conductor 1a is divided into two portions, which serve as via conductors 1 present respectively in the unit substrates 10 adjacent to each other.

Figure 7:
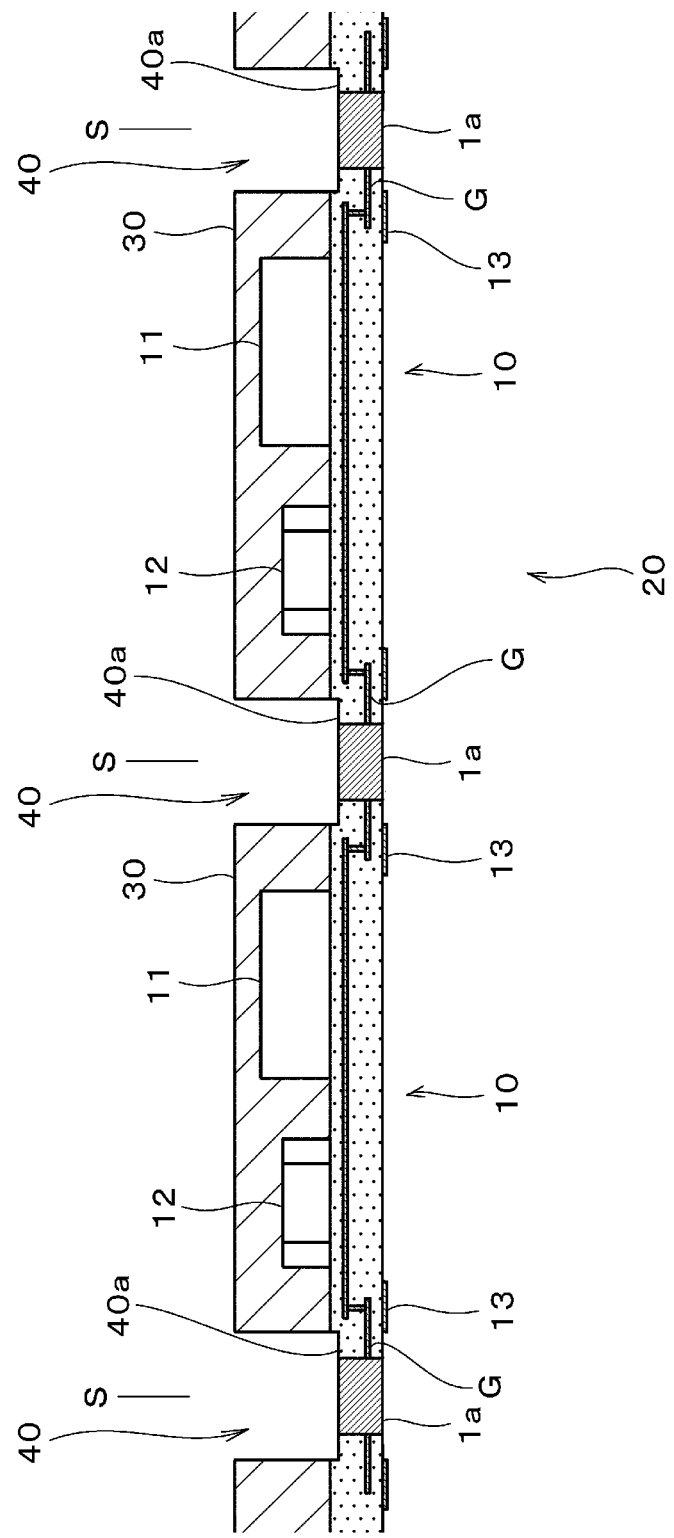
FIG. 7 is a front sectional view illustrating a state where a half-cut groove is formed in the collective substrate, illustrated in FIG. 6B, after forming the encapsulation layer.
Figure 8:
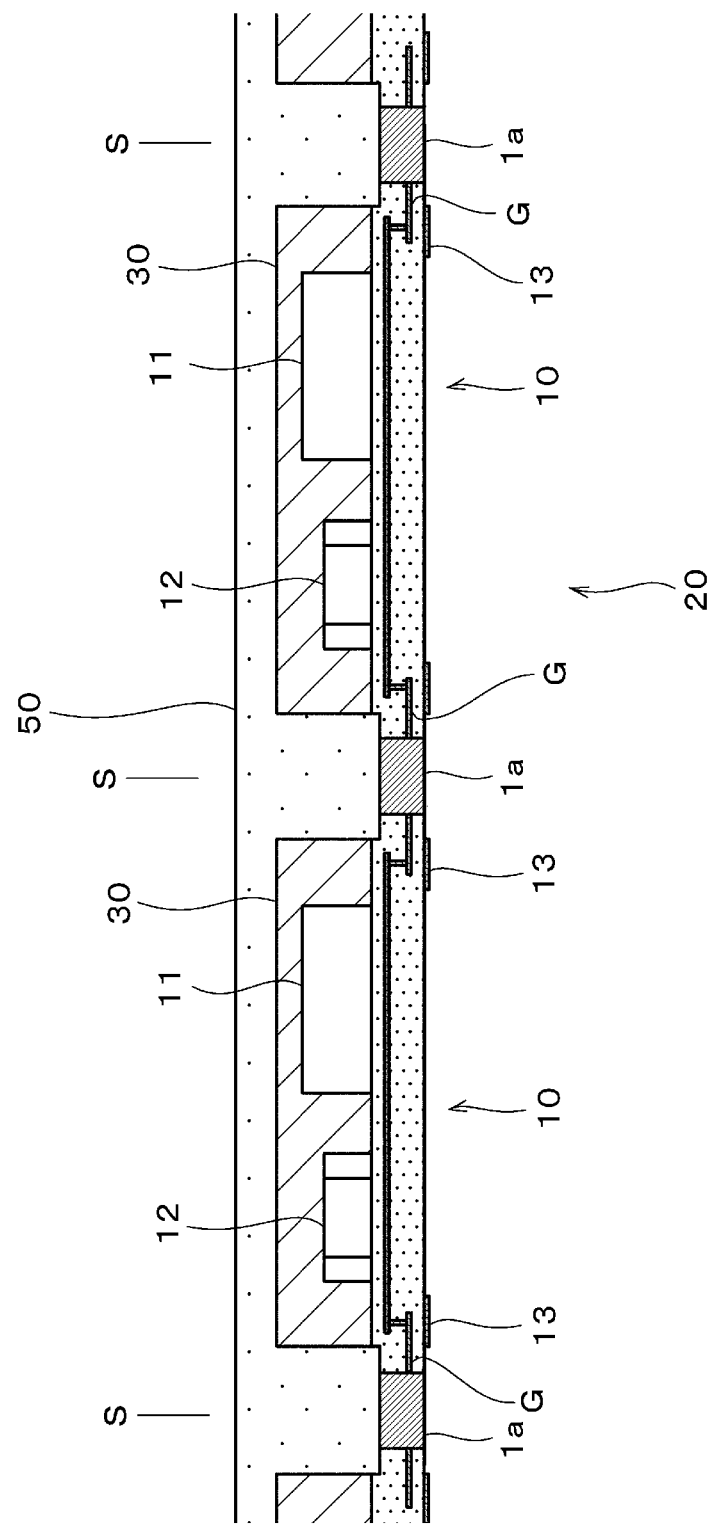
FIG. 8 is a front sectional view illustrating a state where a conductive shield layer is formed on the collective substrate, illustrated in FIG. 7, after forming the half-cut groove.
Figure 9:
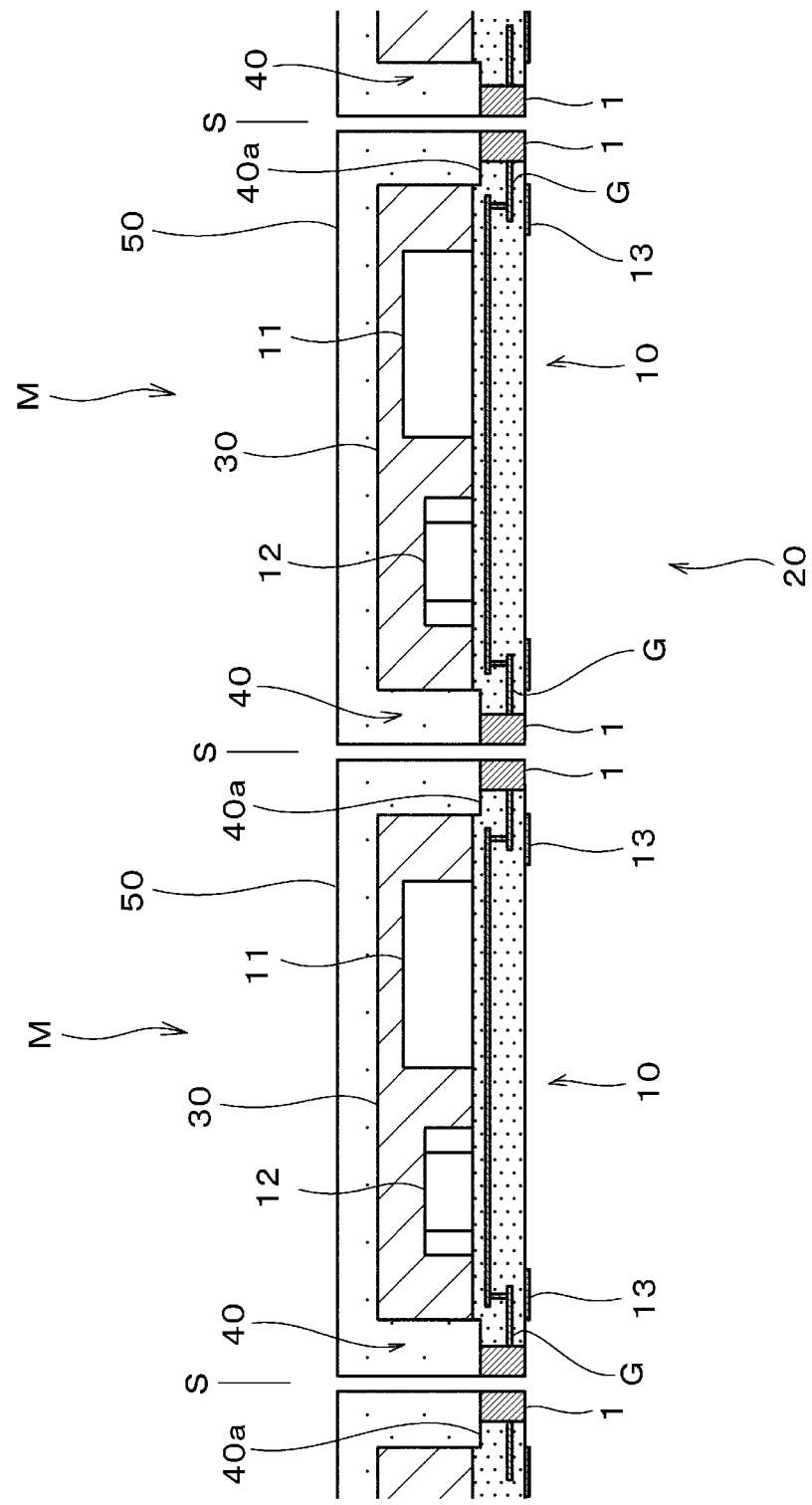
FIG. 9 is a front sectional view illustrating a state where the collective substrate, illustrated in FIG. 8, is cut at predetermined positions and is divided into individual unit substrates.

Using that collective substrate 20, the following steps are performed in accordance with a method and procedures similar to those in the first preferred embodiment described above.
(a) Mount the electronic components 11 and 12,
(b) Form an encapsulation layer 30 that encapsulates a component mounting surface of the collective substrate 20 and the electronic components 11 and 12 mounted on the component mounting surface,
(c) Half-cut the collective substrate 20 from a substrate surface on the side containing the encapsulation layer 30, to thereby form a half-cut groove 40 having a bottom surface 40a at which the via conductor 1a is exposed (see FIG. 7),
(d) Form a conductive shield layer 50 (see FIG. 8), and
(e) Cut the collective substrate 20 for division into the individual unit substrates 10 (see FIG. 9).

Figure 10:
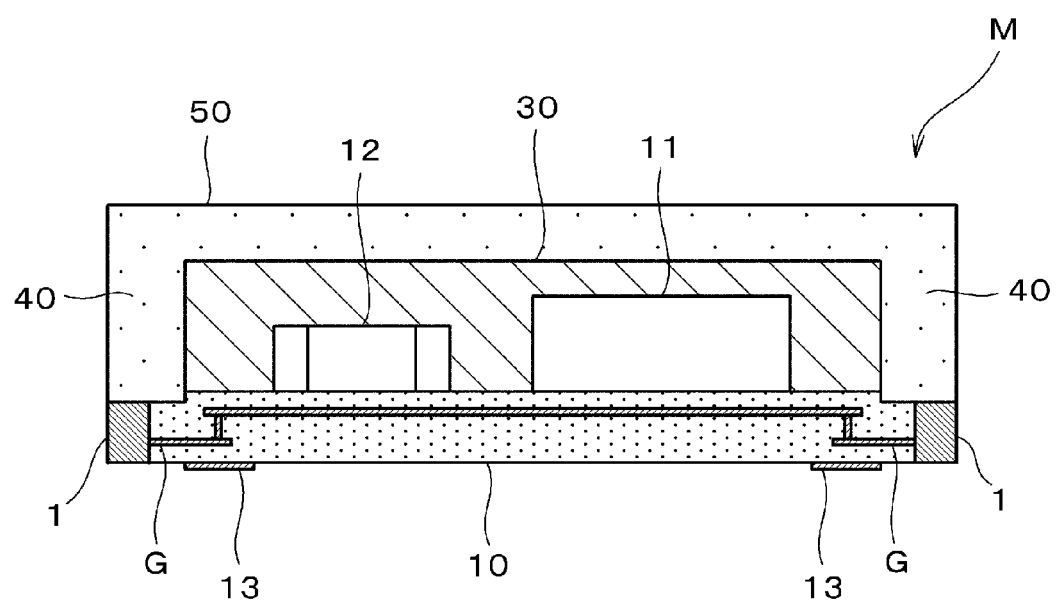
FIG. 10 is a front sectional view illustrating the construction of a high frequency module that is manufactured by a method according to a second preferred embodiment of the present invention.

Through the steps described above, one via conductor 1a is divided in the step (e) into two portions defining the via conductors 1, which are positioned in one-to-one relationship in the pair of unit substrates 10 adjacent to each other, as illustrated in FIG. 10. Thus, the high frequency module M is obtained which has a structure in which the conductive shield layer 50 is electrically conducted to the ground electrode G through the divided via conductor 1.

Since the conductive shield layer 50 is formed after forming the half-cut groove 40 and the collective substrate 20 is then cut, there is no risk that the divided via conductors 1 may slip off when one via conductor 1a is divided into two portions.

In comparison with the above-described first preferred embodiment in which two via conductors 1 each defining one via conductor 1 in each of the unit substrates 10 after the division are disposed between the pair of unit substrates 10 adjacent to each other, the second preferred embodiment is advantageous in that, just by disposing one via conductor 1a between the pair of unit substrates 10 adjacent to each other, each unit substrate (high frequency module M) including the via conductor 1 after the division of the one via conductor 1a can be manufactured with higher efficiency.

Third Preferred Embodiment

FIG. 11A is a plan view illustrating a collective substrate used in another preferred embodiment (third preferred embodiment) of the present invention, and FIG. 11B is a front sectional view illustrating a state where a component mounting surface of the collective substrate, illustrated in FIG. 11A, is encapsulated with an encapsulation layer.

The first preferred embodiment described above preferably includes the collective substrate 20 in which two via conductors 1 penetrating through the collective substrate 20 are disposed between each pair of unit substrates 10 adjacent to each other and, after the division into the individual unit substrates 10, one of the two via conductors 1 is positioned in one of the paired unit substrates 10, while the other one of the two via conductors 1 is positioned in the other unit substrate 10. Like this third preferred embodiment of the present invention, however, a collective substrate 20 may also be used, in which, as illustrated in FIG. 11B (or 12), the via conductor 1 preferably extends from the upper surface side of the collective substrate (or the unit substrate 10) to a position halfway the collective substrate 20 in the direction of thickness thereof without penetrating through the collective substrate 20.

Figure 12:
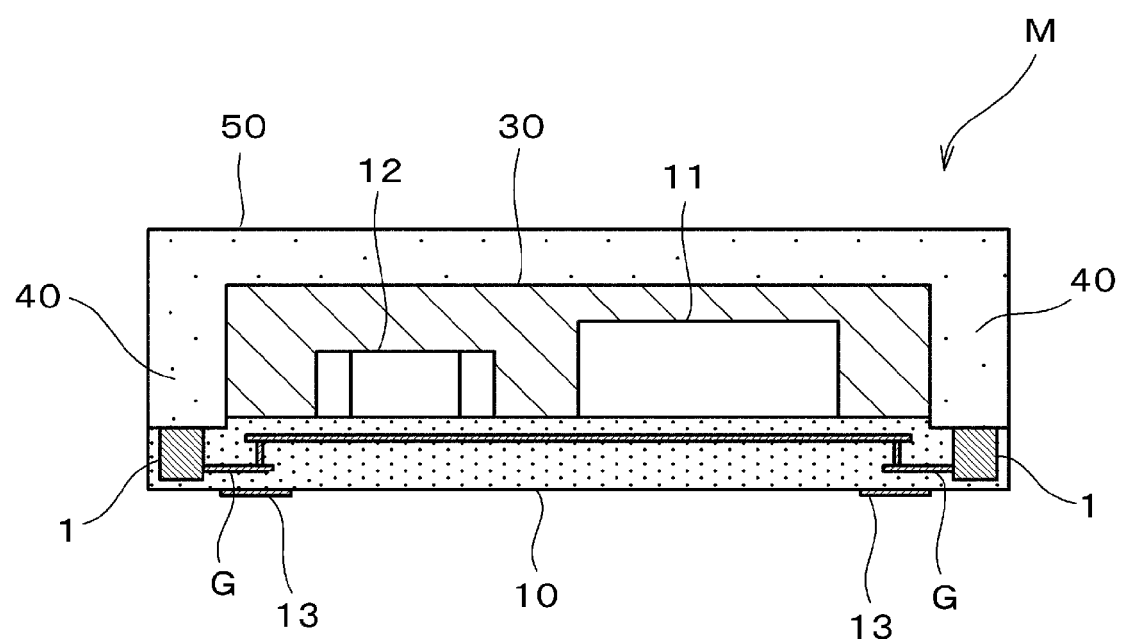
FIG. 12 is a front sectional view illustrating the construction of a high frequency module that is manufactured by a method according to a third preferred embodiment of the present invention.

Even in the case using the collective substrate 20, illustrated in FIGS. 11A and 11B, which includes the via conductor 1 not penetrating through the collective substrate 20, a high frequency module M having a structure, illustrated in FIG. 12, in which the conductive shield layer 50 is connected to the ground electrode G through the via conductor 1 not penetrating through the unit substrate 10, can also be manufactured in accordance with a method and procedures similar to those in the first preferred embodiment described above.

Fourth Preferred Embodiment

FIG. 13A is a plan view illustrating a collective substrate used in still another preferred embodiment (fourth preferred embodiment) of the present invention, and FIG. 13B is a front sectional view illustrating a state where a component mounting surface of the collective substrate, illustrated in FIG. 13A, is encapsulated with an encapsulation layer.

In the second preferred embodiment described above, as illustrated in FIGS. 6A and 6B, the collective substrate 20 is preferably used, and in which one via conductor 1a (i.e., a via conductor 1a before being divided) penetrating through the collective substrate 20 is disposed between the unit substrates adjacent to each other, and in which when the collective substrate 20 is divided into the individual unit substrates 10, the one via conductor 1a is divided into two portions, which serve as the via conductors 1 present in one-to-one relationship in the unit substrates 10 adjacent to each other. Like this fourth preferred embodiment of the present invention, however, a collective substrate 20 may also be used and in which, as illustrated in FIG. 13B, the one via conductor 1a (i.e., the via conductor 1a before being divided) is arranged to extend up to a position halfway along the collective substrate 20 in the direction of thickness thereof without penetrating through the collective substrate 20.

Figure 14:
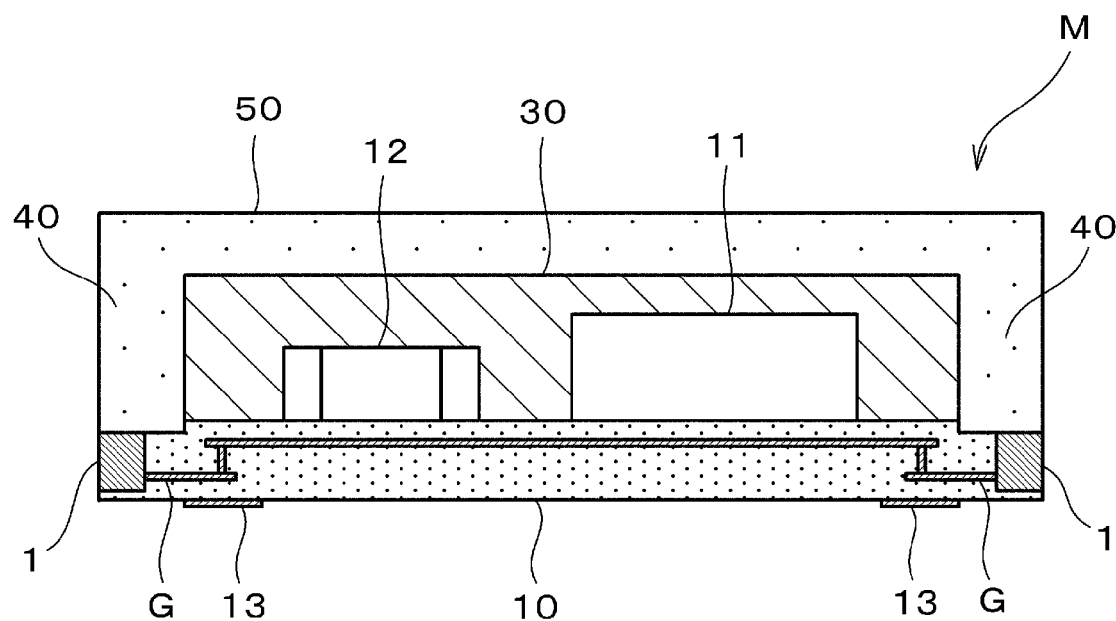
FIG. 14 is a front sectional view illustrating the construction of a high frequency module that is manufactured by a method according to the fourth preferred embodiment of the present invention.

Even in the case using the collective substrate 20, illustrated in FIGS. 13A and 13B, which includes the via conductor 1a not penetrating through the collective substrate 20, a high frequency module M having a structure, illustrated in FIG. 14, in which the conductive shield layer 50 is connected to the ground electrode G through the via conductor 1 not penetrating through the unit substrate 10, can also be manufactured in accordance with a method and procedures similar to those in the second preferred embodiment described above.

While the third and fourth preferred embodiments described above include the collective substrates 20 in which the via conductor 1 and the via conductor 1a, each not penetrating through the collective substrate 20, are exposed at the upper surface side of the collective substrate 20, the via conductor 1 and/or the via conductor 1*a* may be disposed inside the collective substrate 20 so as not to be exposed at any of the upper surface side and the lower surface side of the collective substrate 20 insofar as the via conductor 1 and/or the via conductor 1*a* can be exposed in the step of forming the half-cut groove.

Fifth Preferred Embodiment

Figure 15:
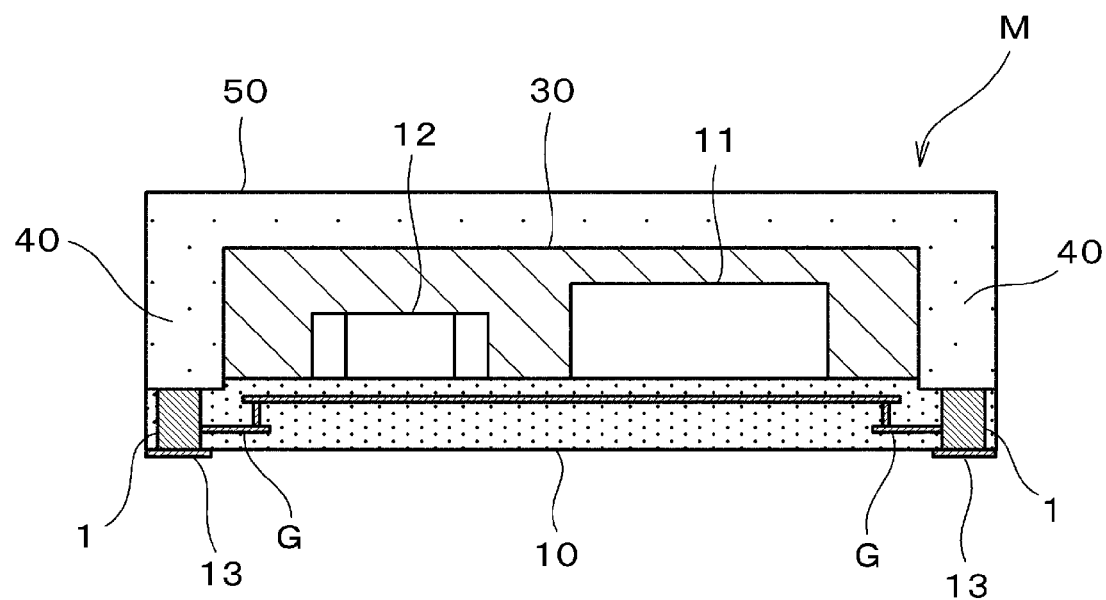
FIG. 15 is a front sectional view illustrating the construction of a high frequency module according to still another preferred embodiment (fifth preferred embodiment) of the present invention.
Figure 16:
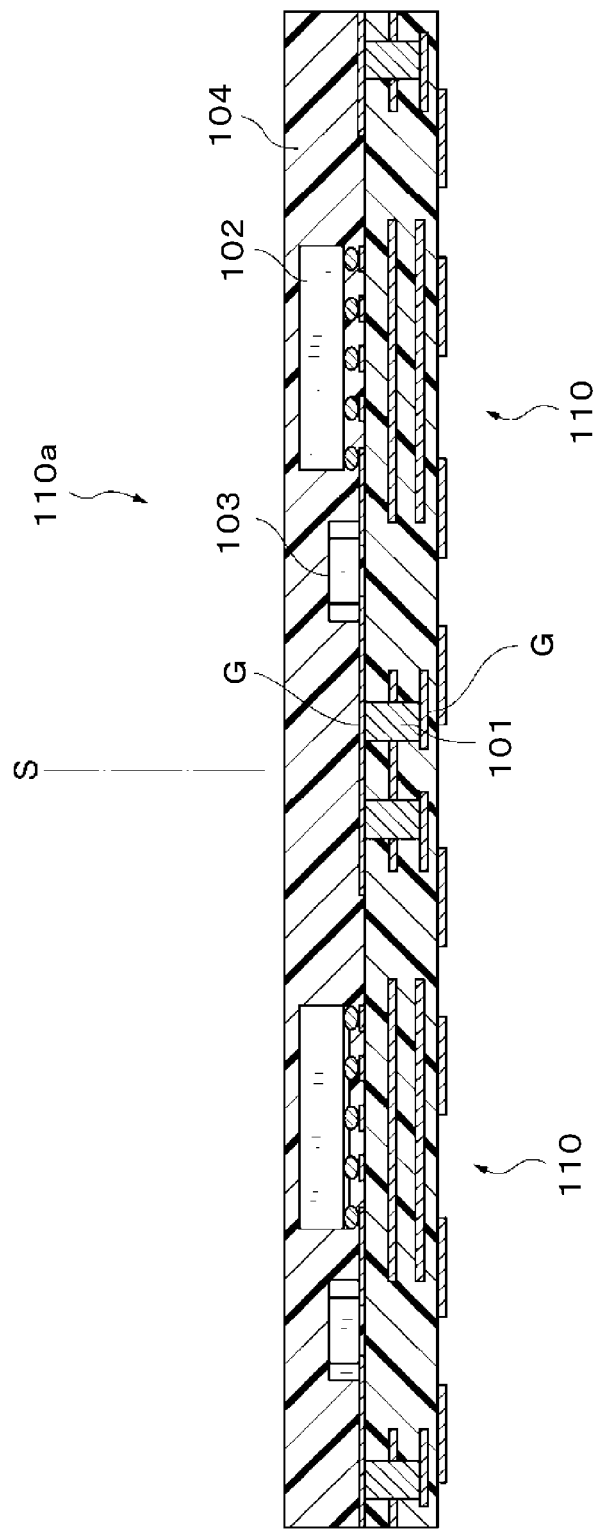
FIG. 16 is a sectional view illustrating one step of an electronic module manufacturing method of related art.
Figure 17:
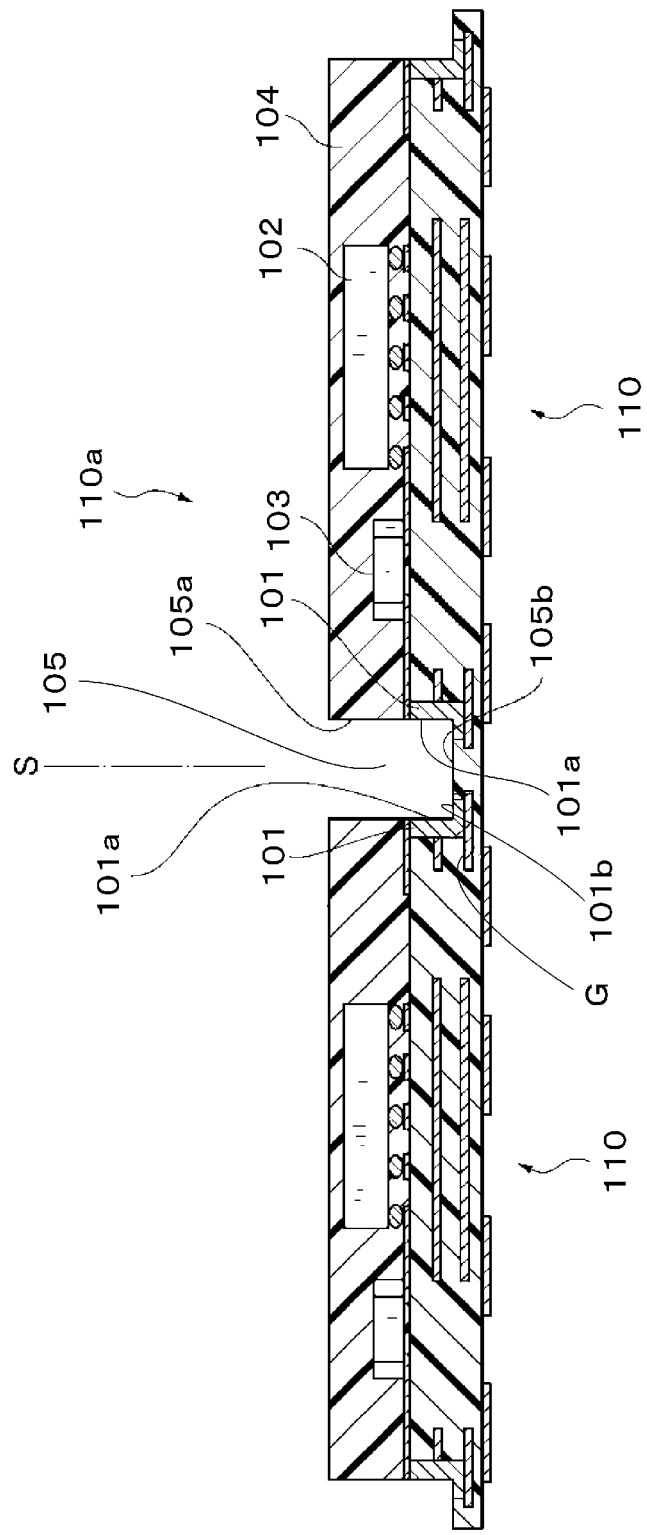
FIG. 17 is a sectional view illustrating another step of the electronic module manufacturing method of the related art.
Figure 18:
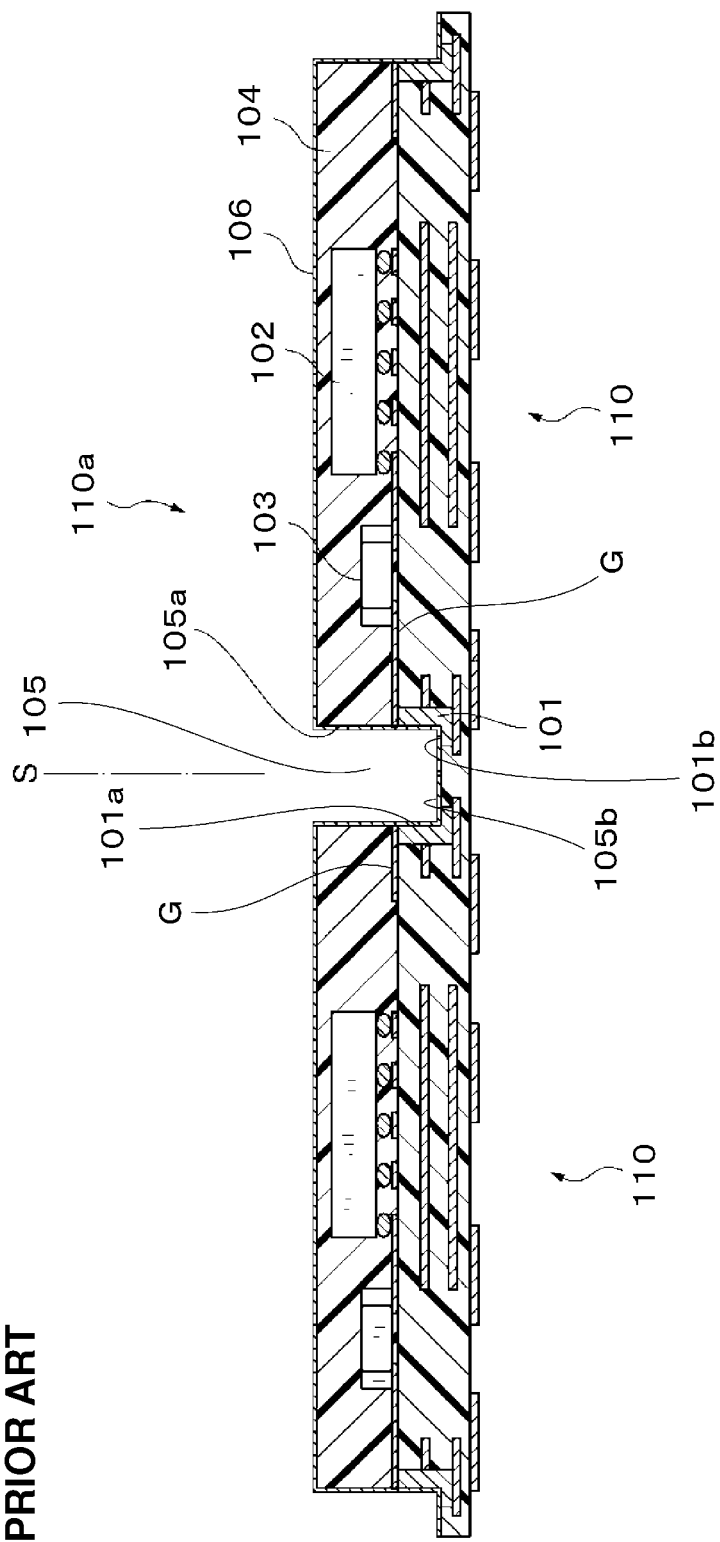
FIG. 18 is a sectional view illustrating still another step of the electronic module manufacturing method of the related art.

FIG. 15 is a front sectional view illustrating a high frequency module according to still another preferred embodiment (fifth preferred embodiment) of the present invention.

A high frequency module M according to the fifth preferred embodiment has a structure that the above-mentioned outer electrode 13 defines an electrode connected to a ground electrode (not illustrated) and the outer electrode 13 is disposed to be directly connected to a lower end surface of the via conductor 1. The other construction is preferably the same as that of the high frequency module M, illustrated in FIG. 1, which is manufactured by the method described above in connection with the first embodiment, and components in FIG. 15 denoted by the same reference symbols as those in FIG. 1 represent the same components as those in FIG. 1.

In the high frequency module according to this fifth preferred embodiment, as mentioned above, the outer electrode 13 at the ground potential and the conductive shield layer 50 are electrically conducted to each other through the via conductor 1, which is preferably arranged to penetrate through a stepped portion at a periphery of the substrate (unit substrate 10), the stepped portion being positioned at a slightly lower level than that of the component mounting surface, and which is directly connected to the outer electrode 13. Therefore, the conductive shield layer 50 can be connected to the outer electrode 13 at the ground potential through a shorter distance, and the shielding performance of the conductive shield layer 50 can be increased.

The high frequency module according to the fifth preferred embodiment can be efficiently manufactured by using the method described above in connection with the first preferred embodiment, by adding a step of adjusting the position where the outer electrode is disposed.

It is to be noted that the present invention is not limited to the above-described preferred embodiments and can be carried out in various applications and modifications within the scope of the present invention regarding, e.g., the practical layout of the via conductors, the detailed structures of the collective substrate and the unit substrate, the type of materials forming the encapsulation layer and the conductive shield layer, the type of a jig used in forming the half-cut groove, as well as the method of cutting the collective substrate for division into the individual unit substrates.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A method of manufacturing a high frequency module including an electronic component mounted on a component-mounting surface of a unit substrate including a via conductor electrically conducted to a ground electrode, the component-mounting surface is encapsulated with an encapsulation layer made of an insulating material, along with the electronic component, and a conductive shield layer covers the encapsulation layer and is electrically conducted to the via conductor, the method comprising the steps of:

preparing a collective substrate including a plurality of unit substrates successively connected in a matrix pattern, each of the plurality of unit substrates including the via conductor electrically conducted to the ground electrode in a peripheral portion thereof;

mounting predetermined electronic components on a component-mounting surface of the collective substrate;

encapsulating the component-mounting surface of the collective substrate and the electronic components with the encapsulation layer made of the insulating material;

cutting the collective substrate including the encapsulation layer disposed thereon from a substrate surface on the side containing the encapsulation layer, thereby forming a half-cut groove penetrating through the encapsulation layer for division thereof and extending partially but not entirely through the collective substrate in a direction of thickness thereof such that the via conductor is exposed only at a bottom surface of the half-cut groove;

forming a conductive shield layer to cover the encapsulation layer and being electrically conducted to the via conductor that is exposed at the bottom surface of the half-cut groove; and cutting the collective substrate for division into individual unit substrates each including the via conductor and the conductive shield layer electrically conducted to the ground electrode through the via conductor; wherein the bottom surface of the half-cut groove defined by the lowermost horizontal surface of the half-cut groove.

2. The method of manufacturing the high frequency module according to claim 1, wherein:

looking at a pair of unit substrates adjacent to each other with the half-cut groove interposed between the pair of unit substrates, the via conductor exposed at the bottom surface of the half-cut groove is disposed in a straddling relationship over the pair of unit substrates;

in the step of cutting the collective substrate for division into individual unit substrates, the via conductor straddling the pair of unit substrates is divided into two via conductors that belong respectively to the pair of unit substrates; and in each of the pair of unit substrates after being divided, the conductive shield layer is electrically conducted to the ground electrode through one of the two divided via conductors.

3. The method of manufacturing the high frequency module according to claim 1, wherein the via conductor is formed to penetrate the collective substrate from an upper surface of the collective substrate to a lower surface of the collective substrate in a direction of thickness thereof.

* * * * *